(12) United States Patent
Iki

(10) Patent No.: US 7,403,237 B2
(45) Date of Patent: Jul. 22, 2008

(54) ELECTRO-OPTICAL DEVICE WITH ELECTROLYTIC CORROSION PREVENTING FILM AND MULTIPLE RELAY ELECTRODES

(75) Inventor: Takunori Iki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 319 days.

(21) Appl. No.: 11/029,502

(22) Filed: Jan. 6, 2005

(65) Prior Publication Data

US 2005/0161830 A1  Jul. 28, 2005

(30) Foreign Application Priority Data

Jan. 26, 2004 (JP) ............... 2004-017252
Sep. 30, 2004 (JP) ............... 2004-289339

(51) Int. Cl.
*G02F 1/136* (2006.01)
*G02F 1/1343* (2006.01)

(52) U.S. Cl. ............ 349/43; 349/39; 349/111; 349/139; 349/147

(58) Field of Classification Search ......... 349/43, 349/147

See application file for complete search history.

(56) References Cited

U.S. PATENT DOCUMENTS

| | | | |
|---|---|---|---|
| 6,195,138 B1 | 2/2001 | Shimada et al. | |
| 6,448,580 B1* | 9/2002 | Arai et al. | 257/72 |
| 6,836,302 B2* | 12/2004 | Sato | 349/46 |
| 6,850,292 B1 | 2/2005 | Murade | |
| 2001/0052950 A1* | 12/2001 | Yamazaki et al. | 349/43 |
| 2002/0080294 A1* | 6/2002 | Nakamura | 349/43 |
| 2002/0176032 A1* | 11/2002 | Maeda et al. | 349/43 |
| 2003/0086046 A1* | 5/2003 | You | 349/149 |
| 2003/0107698 A1* | 6/2003 | Nagayama et al. | 349/149 |
| 2003/0128178 A1* | 7/2003 | Murade | 345/87 |
| 2004/0036824 A1* | 2/2004 | Lee | 349/113 |

FOREIGN PATENT DOCUMENTS

| | | |
|---|---|---|
| JP | 5-235360 | 9/1993 |
| JP | A 08-236777 | 9/1996 |
| JP | A 09-152625 | 6/1997 |
| JP | A 09-265114 | 10/1997 |
| JP | 9-307113 | 11/1997 |
| JP | A 11-316382 | 11/1999 |
| JP | A 2003-222846 | 8/2003 |
| WO | WO 00/39634 | 7/2000 |

* cited by examiner

*Primary Examiner*—Andrew Schechter
*Assistant Examiner*—Nathanael R Briggs
(74) *Attorney, Agent, or Firm*—Oliff & Berridge, PLC

(57) ABSTRACT

There is provided an electro-optical device comprising, above a substrate, a first conductor layer, a second conductor layer, an interlayer insulating film formed between the first conductor layer and the second conductor layer, and a contact hole, provided in the interlayer insulating film, for electrically connecting the first conductor layer and the second conductor layer in a contact portion. The first conductor layer has a multilayered structure in which an electrolytic corrosion preventing film is provided on a conductor film, in a region including at least the contact portion among the entire region thereof, and the electrolytic corrosion preventing film is not provided in other regions thereof. Thus, an electrolytic corrosion can be prevented and a contact resistance can be reduced. Further, heat can be prevented from generating.

5 Claims, 9 Drawing Sheets

ELECTRO-OPTICAL DEVICE WITH ELECTROLYTIC CORROSION PREVENTING FILM AND MULTIPLE RELAY ELECTRODES

BACKGROUND

The present invention relates to an electro-optical device which comprises a conductive layer having a light-shielding function, and a method of manufacturing the electro-optical device.

A liquid crystal device is constructed by sealing liquid crystal between two substrates which are made of glass substrates, quartz substrates, or the like. In the liquid crystal device, active elements, such as thin film transistors (hereinafter, referred to as 'TFTs'), and pixel electrodes are arranged in a matrix shape on the one of two substrates. On the other substrate, a counter electrode (transparent electrode (ITO (indium tin oxide)) is arranged. In this way, the optical properties of the liquid crystal layer sealed between both substrates change according to image signals, such that image display can be implemented.

In an electro-optical device, such as an active matrix driving type liquid crystal device using the active elements, the pixel electrodes and switching elements are provided on the substrate (active matrix substrate) corresponding to intersections of a plurality of scanning lines (gate lines) and a plurality of data lines (source lines) which are arranged in longitudinal and traverse directions, respectively.

The switching element, such as the TFT element, is turned on by an ON signal which is supplied to the gate line, and the image signal which is supplied through the source line is written into the pixel electrode (transparent electrode (ITO)). Thus, voltage based on the image signal is applied to the liquid crystal layer between the pixel electrode and the counter electrode, and the alignment states of liquid crystal molecules change. In this way, transmittance of a pixel changes and light passing through the pixel electrode and the liquid crystal layer changes according to the image signal, such that the image display can be implemented.

In the case where elements constituting an element substrate are formed in one plane on the substrate, the occupied area of each element increases and the area of the pixel electrode is reduced, such that the pixel opening ratio is lowered. Therefore, conventionally, a laminated structure in which the elements are separately formed in the respective one of plural layers and interlayer insulating films are disposed between the respective layers is adopted.

Specifically, the element substrate is constructed by laminating a semiconductor thin film, an insulating thin film, or a conductive thin film with a predetermined pattern on a glass or quartz substrate. A TFT substrate or the like is formed by repeatedly performing a film formation step and a photolithography step over various films.

For example, on the TFT substrate, the semiconductor layer constituting a channel of the TFT element, a wiring layer for the data line or the like, or a pixel electrode layer made of an ITO film are laminated. The pixel electrode layer is formed near the liquid crystal layer as an uppermost layer of the active matrix substrate and the pixel electrode is connected to the semiconductor layer through the wiring layer. Generally, the wiring layer for the data line or the like is made of aluminum. However, if aluminum and the ITO film are connected with each other through a contact hole, an electrolytic corrosion that the ITO film blacks due to an alkali delamination solution used for patterning is caused.

Therefore, in order to prevent the electrolytic corrosion, a multilayered wiring layer in which titanium nitride (TiN) is laminated on aluminum is adopted.

Further, for example, when aluminum as the conductive layer is connected with aluminum through a contact hole, a contact resistance increases due to the oxidization of aluminum. In this case, in order to reduce the contact resistance between aluminum and aluminum, an aluminum wiring line also has a multilayered structure of aluminum and titanium nitride.

In an electro-optical device, in order to prevent the TFT element from erroneously operating due to light incident thereon, a light-shielding film is formed. Further, the electro-optical device having the multilayered structure, it is constructed such that the conductive layer such as aluminum also serves as the light-shielding layer. Thus, reflected light or irregularly reflected light, as well as incident light, is effectively prevented from entering into the TFT element or the like.

Titanium nitride has light absorption efficiency much higher than aluminum or the like. For this reason, as regards the multilayered conductive layer (including the light-shielding layer) of titanium nitride and aluminum, there are problems in that much light is absorbed and heat is caused in the substrate.

SUMMARY

The present invention has been made in consideration of the above-mentioned problems, and it is an object of the present invention to provide an electro-optical device and a method of manufacturing the electro-optical device which can prevent the electrolytic corrosion to reduce the contact resistance, and suppress the heat in the substrate, by adopting conductive layers in which a multilayered structure of an electrolytic corrosion preventing film or oxidization preventing film and a conductive film is formed in a contact portion of the conductive layers or a contact portion of the conductive layer and ITO, and a single-layered structure is at least partially formed in other portions.

An electro-optical device according to the present invention comprises, above a substrate, a first conductor layer, a second conductor layer, an interlayer insulating film formed between the first conductor layer and the second conductor layer, and a contact hole, provided in the interlayer insulating film, for electrically connecting the first conductor layer and the second conductor layer in a contact portion, in which the first conductor layer has a multilayered structure in which an electrolytic corrosion preventing film is provided on a conductor film, in a region including at least the contact portion among the entire region thereof, and in which the electrolytic corrosion preventing film is not provided in other regions thereof.

According to this configuration, the first conductor layer and the second conductor layer are electrically connected with each other through the contact hole provided in the interlayer insulating film. In at least the contact portion of the first conductor layer and the second conductor layer, the first conductor layer has the multilayered structure where the electrolytic corrosion preventing film is formed on the conductor film. Thus, the electrolytic corrosion in the second conductor layer is prevented from occurring. Further, regions other than the partial region including the contact portion among the entire region of the conductor layer have a single-layered of the conductor film. Thus, even when light is incident on the conductor film, heat can be suppressed from generating.

Further, the electrolytic corrosion preventing film is a titanium nitride film or a titanium film.

According to this configuration, by the titanium nitride film or the titanium film, the electrolytic corrosion in the second conductor layer can be prevented.

Further, the first conductor layer has a plurality of conductor films which are formed in the same layer and with the same process.

According to this configuration, for example, the region of the first conductor layer not including the contact portion can have the single-layered structure and the region of the first conductor layer including the contact portion can have the multilayered structure.

Further, at least one of the plurality of conductor films has a light-shielding function.

According to this configuration, the first conductor layer having the light-shielding function can be formed with the single-layered structure where the electrolytic corrosion preventing film is not laminated, and thus heat can be prevented from generating.

Further, an electro-optical device according to the present invention comprises, above a substrate, a first conductor layer, a second conductor layer, an interlayer insulating film interposed between the first conductor layer and the second conductor layer, and a contact hole, provided in the interlayer insulating film, for electrically connecting the first conductor layer and the second conductor layer in a contact portion, in which the first conductor layer or the second conductor layer has a multilayered structure of an oxidization preventing film and a conductor film in a region including at least the contact portion among the entire region thereof, and in which the oxidization preventing film is not provided in other regions thereof.

According to this configuration, the first conductor layer and the second conductor layer are electrically connected by using the contact hole provided in the interlayer insulating film. In at least the contact portion connecting the first and second conductor layers with each other, the first or second conductor layer has the multilayered structure where the oxidization preventing film is provided on the conductor film. Thus, the contact resistance between the first and second conductor layers can be reduced. Further, the regions other than the region including the contact portion among the entire region of the first or second conductor layer has a single-layered structure of the conductor film. Thus, even when light is incident onto the conductor film, heat can be suppressed from generating.

Further, the oxidization preventing film is a titanium nitride film.

According to this configuration, by the titanium nitride film, the contact resistance between the first and second conductor layers can be reduced.

Further, the first or second conductor layer has a plurality of conductor films which are formed in the same layer and with the same process.

According to this configuration, for example, the region of the first or second conductor layer not including the contact portion has the single-layered structure and the region of the first or second conductor layer including the contact portion has the multilayered structure.

Further, at least one of the plurality of conductor films has a light-shielding function.

According to this configuration, the conductor layer having the light-shielding function can be formed with the single-layered structure where the oxidization preventing film is not laminated, and thus heat can be prevented from generating.

Further, a method of manufacturing an electro-optical device according to the present invention comprises a step of forming a first conductor layer of a multilayered structure, where an electrolytic corrosion preventing film is provided on a conductor film, above a substrate, a step of maintaining an electrolytic corrosion preventing film in a region including at least a contact portion electrically connecting the first conductor layer and a second conductor layer among the entire region of the first conductor layer while removing the electrolytic corrosion preventing film in other regions thereof, a step of forming an interlayer insulating film on the first conductor layer, a step of providing a contact hole in the interlayer insulating film to electrically connect the first conductor layer and the second conductor layer in the contact portion, and a step of forming the second conductor layer on the interlayer insulating film to be electrically connected to the conductor film via the electrolytic corrosion preventing film in the contact portion.

According to this configuration, the first conductor layer is formed with the multilayered structure where the electrolytic corrosion preventing film is provided on the conductor film. Next, the electrolytic corrosion preventing film is left in the region including at least the contact portion electrically connecting the first conductor layer and the second conductor layer among the entire region of the conductor layer, and the electrolytic corrosion preventing film is removed from other regions. The interlayer insulating film is formed on the first conductor layer, and the contact hole is provided in the interlayer insulating film. Next, the second conductor layer is formed on the interlayer insulating film. The second conductor layer is electrically connected to the conductor film via the electrolytic corrosion preventing film in the contact portion. Thus, the electrolytic corrosion in the second conductor layer can be prevented from occurring. Further, the electrolytic corrosion preventing film is removed from the regions except for the portion of the first conductor layer, and thus heat in the portion where the electrolytic corrosion preventing film is removed can be prevented from generating.

Further, a method of manufacturing an electro-optical device according to the present invention comprises a step of forming a first conductor layer above a substrate, a step of forming an interlayer insulating film on the first conductor layer, a step of providing a contact hole in the interlayer insulating film to electrically connect the first conductor layer and a second conductor layer in a contact portion, and a step of forming the second conductor layer on the interlayer insulating film to be electrically connected to the first conductor layer in the contact portion, in which the step of forming the first or second conductor layer comprises a step of forming a multilayered film of an oxidization preventing film and a conductor film, and a step of maintaining the oxidization preventing film in a region including at least the contact portion among the entire region of the first or second conductor layer while removing the oxidization preventing film from other regions thereof.

According to this configuration, first, the first or second conductor layer is formed with the multilayered structure of the oxidization preventing film and the conductor film. Next, the oxidization preventing film is left in the region including at least the contact portion electrically connecting the first and second conductor layers with each other among the entire region of the conductor layer while removing the oxidization preventing film from other regions. The interlayer insulating film is formed on the first conductor layer, and the contact hole is provided in the interlayer insulating film. Next, the second conductor layer is formed on the interlayer insulating film. The first and second conductor layers are connected with each other via the oxidization preventing film in the contact portion. Thus, the contact resistance between the first and second conductor layers can be reduced. Further, the oxidization preventing film is removed from the regions except for the portion of the first or second conductor layer, and thus heat in the portion where the oxidization preventing film is removed can be suppressed from generating.

DETAILED DESCRIPTION OF EMBODIMENTS

Figure 1:
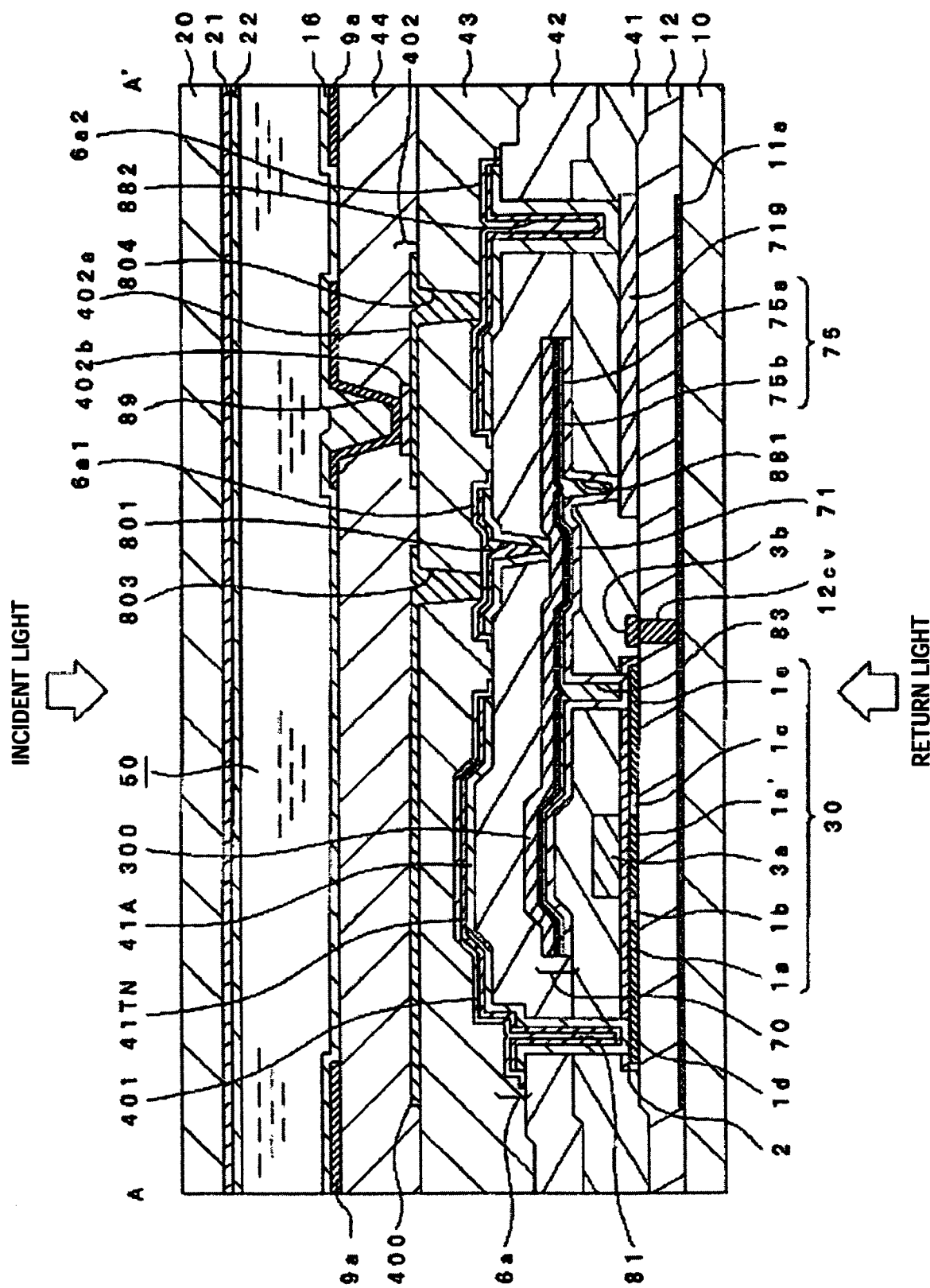
FIG. 1 is a cross-sectional view showing a cross-sectional structure of an electro-optical device according to a first embodiment of the present invention.
Figure 2:
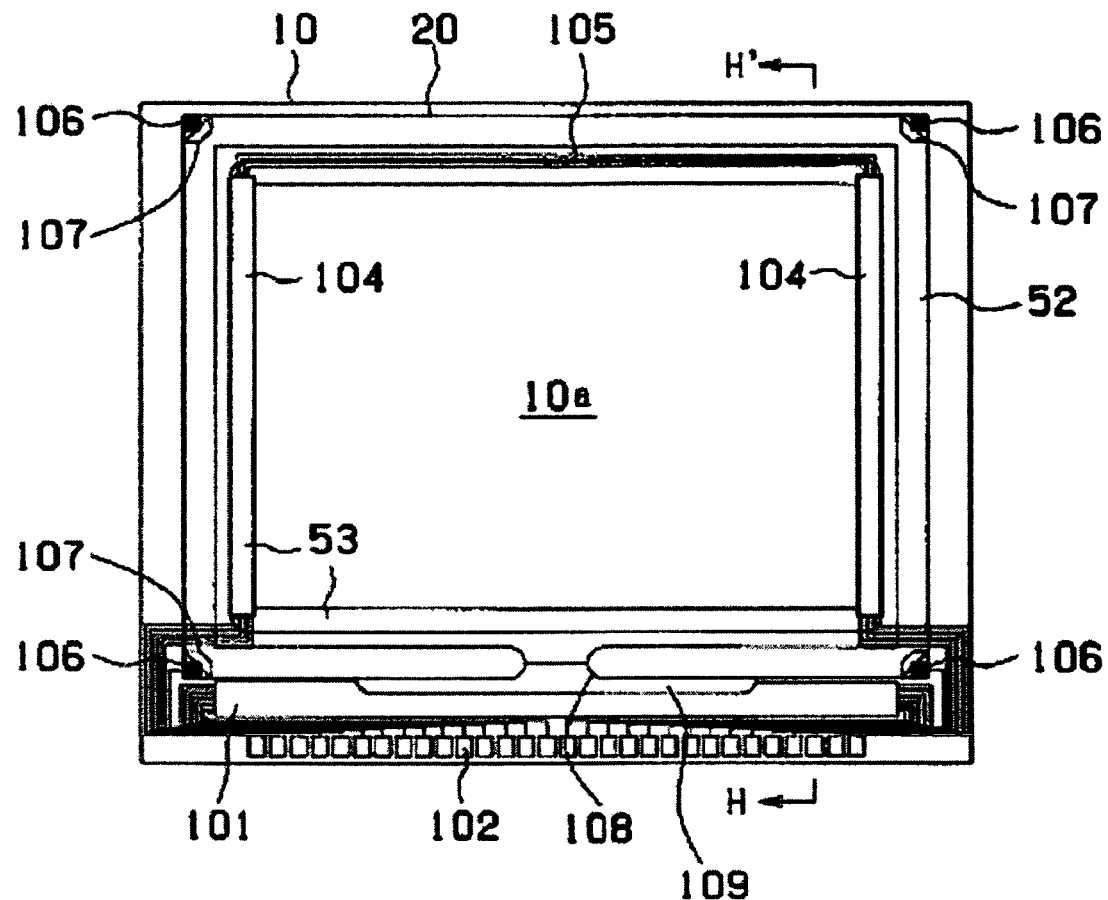
FIG. 2 is a plan view of a liquid crystal device, which is the electro-optical device according to the embodiment, together with various elements formed thereon, as viewed from a counter substrate.
Figure 3:
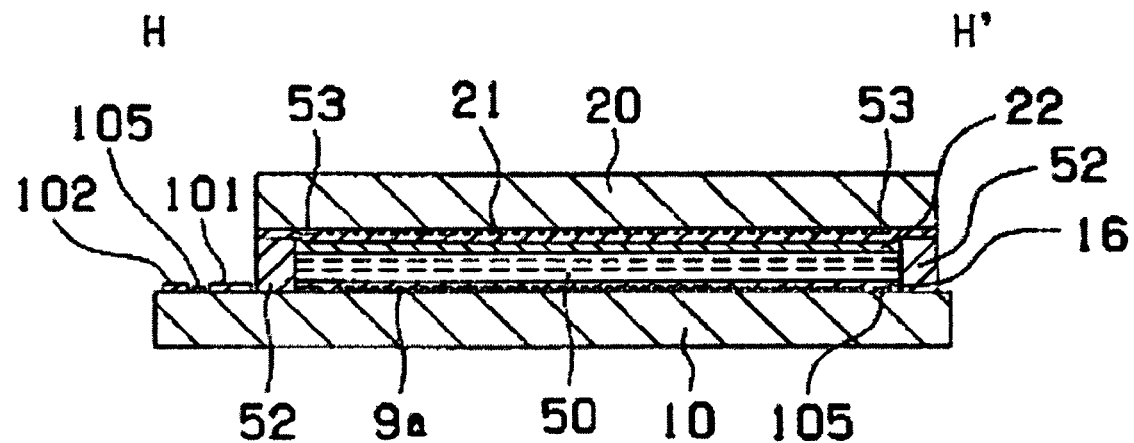
FIG. 3 is a cross-sectional view of the liquid crystal device taken along the line H-H' of FIG. 2 after an assembling step in which an element substrate and a counter substrate are bonded and liquid crystal is sealed between both substrates is completed.
Figure 4:
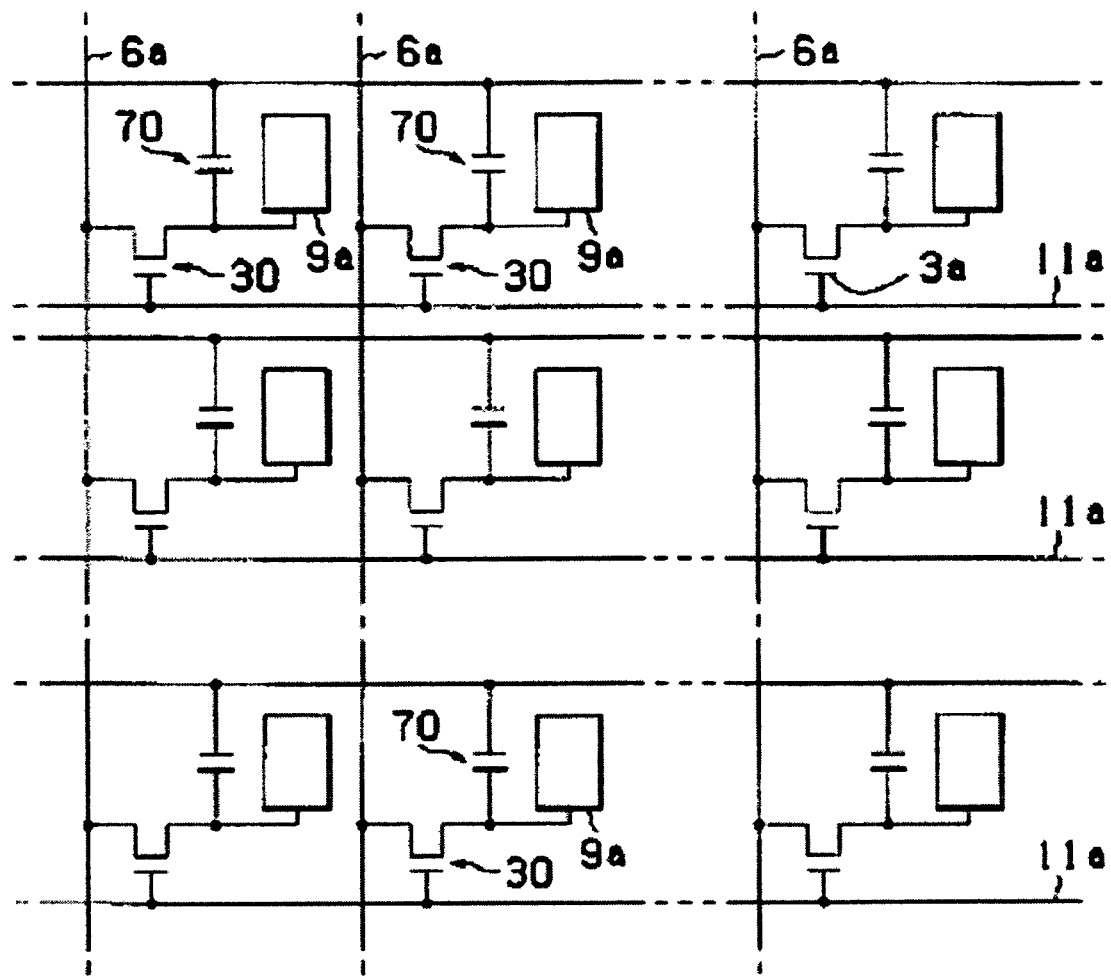
FIG. 4 is an equivalent circuit diagram of various elements, wiring lines, and so on in a plurality of pixels which constitutes pixel regions of the liquid crystal device.
Figure 5:
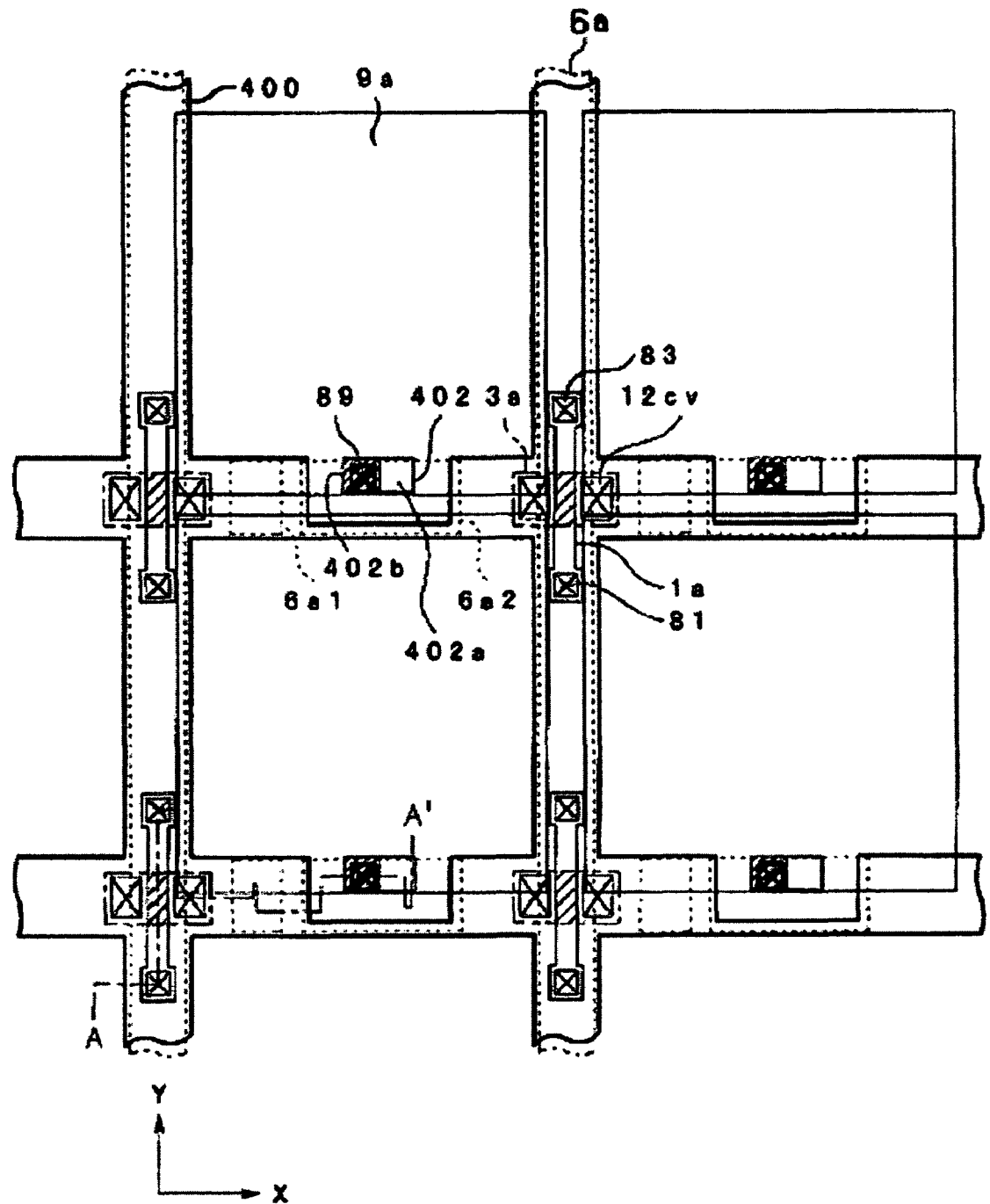
FIG. 5 is a plan view partially showing film formation patterns of respective layers for a plurality of adjacent pixels which are formed on a TFT substrate according to the present embodiment.
Figure 6:
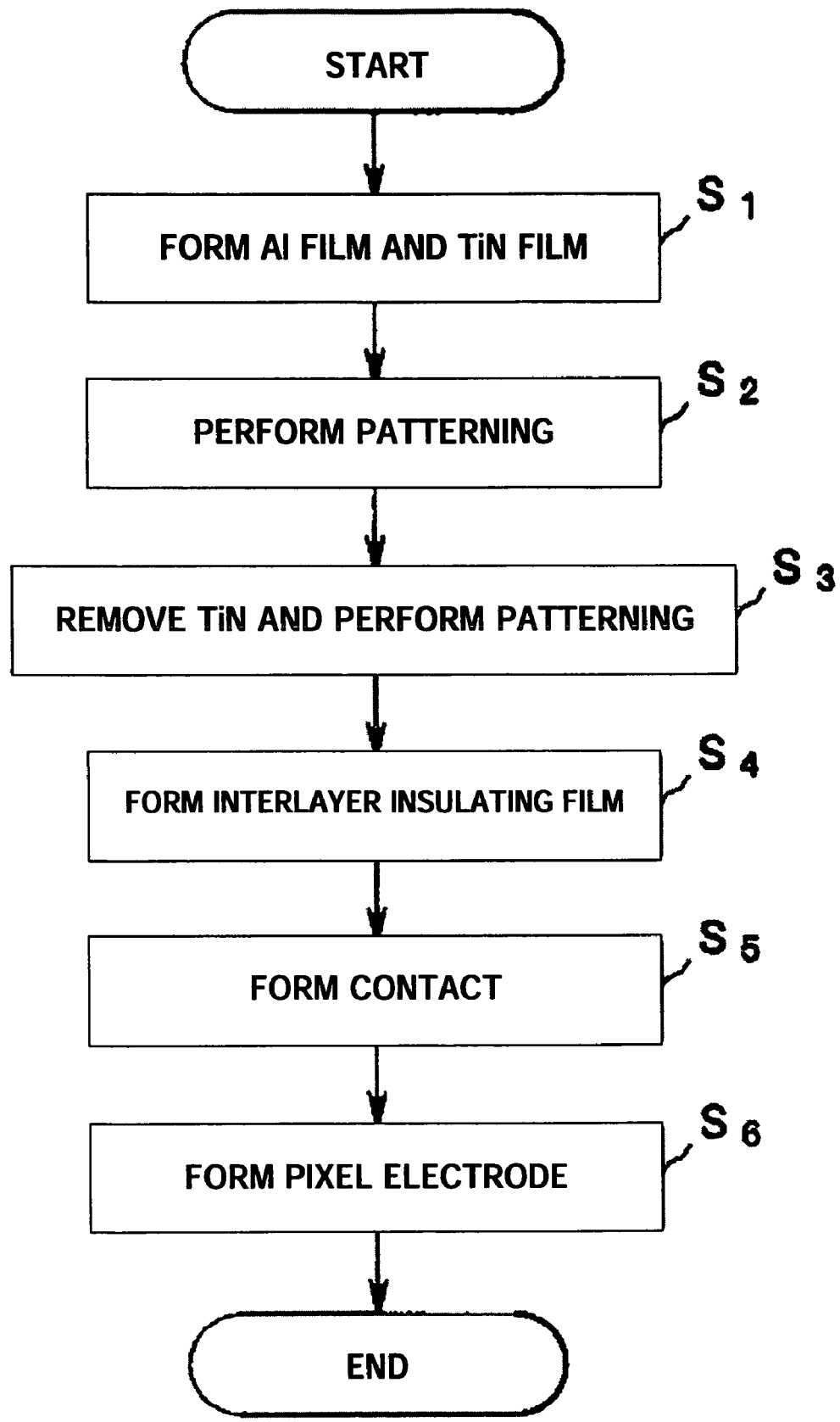
FIG. 6 is a flowchart partially showing a manufacturing method of the liquid crystal device shown in FIG. 1.
Figure 7:
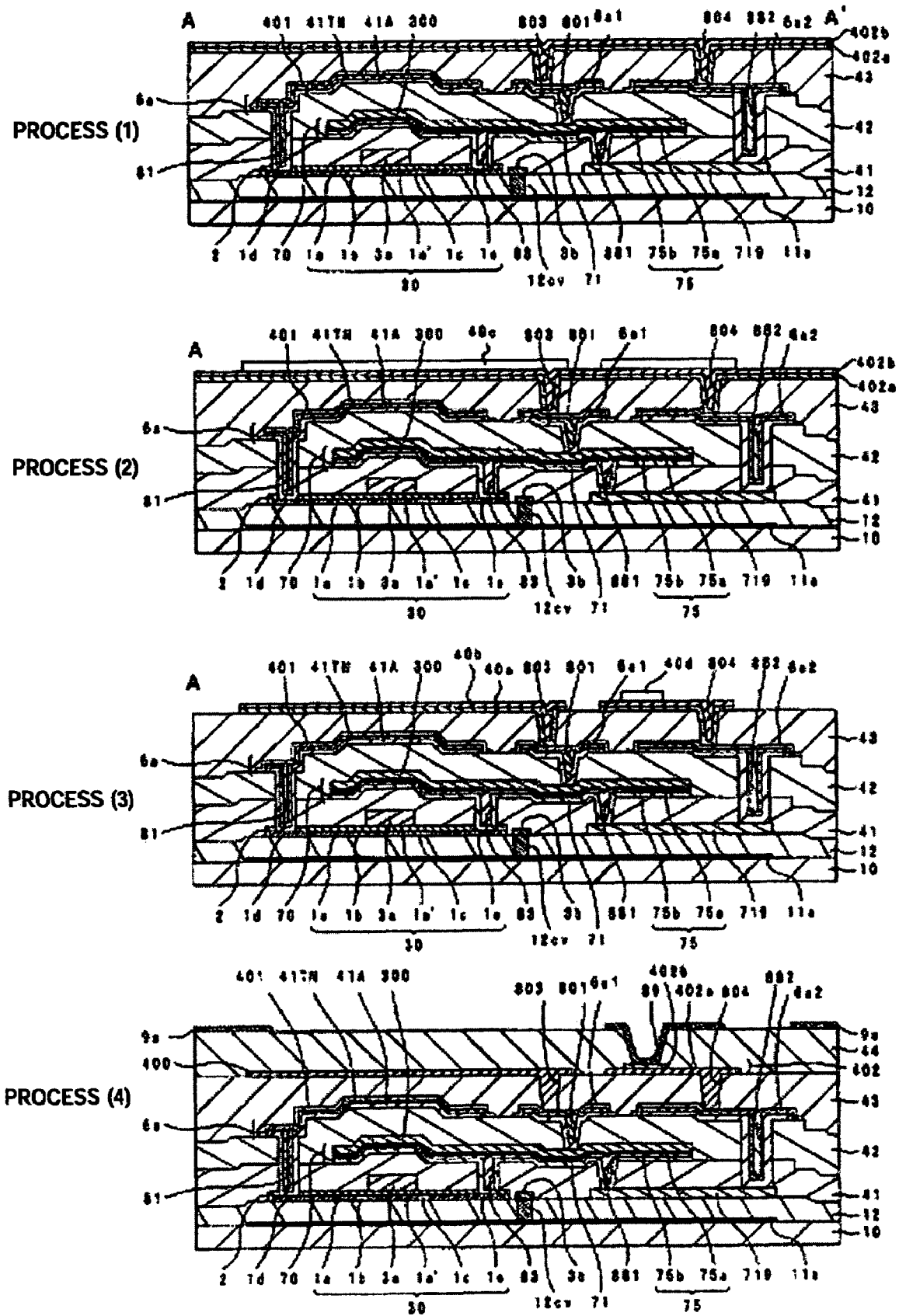
FIG. 7 is a diagram sequentially showing the manufacturing method of FIG. 6 in part in a cross-sectional view.

Hereinafter, an embodiment of the present invention will be described with reference to the drawings. FIG. 1 is a cross-sectional view showing a cross-sectional structure of an electro-optical device according to a first embodiment of the present invention. The present embodiment relates to a liquid crystal device having a TFT substrate or the like. FIG. 2 is a plan view of a liquid crystal device, which is the electro-optical device according to the embodiment, together with various elements formed thereon, as viewed from a counter substrate, and FIG. 3 is a cross-sectional view of the liquid crystal device taken along the line H-H' of FIG. 2 after an assembling step in which an element substrate and a counter substrate are bonded and liquid crystal is sealed between both substrates is completed. Further, FIG. 4 is an equivalent circuit diagram of various elements, wiring lines, and so on in a plurality of pixels which constitutes pixel regions of the liquid crystal device, FIG. 5 is a plan view partially showing film formation patterns of respective layers for a plurality of adjacent pixels which are formed on a TFT substrate according to the present embodiment, FIG. 6 is a flowchart partially showing a manufacturing method of the liquid crystal device shown in FIG. 1, and FIG. 7 is a diagram sequentially showing the manufacturing method of FIG. 6 in part in a cross-sectional view. Moreover, in the respective drawings, to make each layer or each member to be sufficiently understandable size, each layer or each member is shown in a different reduced scale.

First, an entire configuration of a liquid crystal device which is an electro-optical device according to the present embodiment will be described with reference to FIGS. 2 to 4.

As shown in FIGS. 2 and 3, in the liquid crystal device, a liquid crystal 50 is sealed between a TFT substrate 10 as an element substrate and a counter substrate 20. On the TFT substrate 10, pixel electrodes (ITO) 9a constituting pixels and so on are arranged in a matrix shape. Further, on the entire surface of the counter substrate 20, a counter electrode (ITO) 21 is provided. FIG. 4 shows an equivalent circuit of elements constituting the pixels on the TFT substrate 10.

As shown in FIG. 4, in a pixel region, a plurality of scanning lines 11a and a plurality of data lines 6a are wired to intersect each other, and the pixel electrodes 9a are arranged in the matrix shape in regions divided by the scanning lines 11a and the data lines 6a. And then, TFTs 30 are provided to correspond to respective intersections of the scanning lines 11a and the data lines 6a, and the pixel electrodes 9a are connected to the TFTs 30 respectively.

The TFT 30 is turned on by an ON signal of the scanning line 11a, such that an image signal, which is supplied to the data line 6a, is supplied to the pixel electrode 9a. A voltage between the pixel electrode 9a and the counter electrode 21 provided on the counter substrate 20 is applied to the liquid crystal 50. Further, a storage capacitor 70 is provided parallel to the pixel electrode 9a, such that the voltage of the pixel electrode 9a can be maintained for a period of time, for example, three digits longer than the time of the application of a source voltage, by the storage capacitor 70. By the storage capacitor 70, the voltage storing property is improved, and thus image display can be realized in a high contrast ratio.

FIG. 1 is a schematic cross-sectional view of the liquid crystal device paying attention to one pixel, and FIG. 5 is a plan view showing film formation patterns.

In FIG. 5, a plurality of pixel electrodes 9a are provided in the matrix shape on the TFT substrate 10 (an outline thereof is shown in a dot-line portion), and the data lines 6a and scanning lines 11a (not shown in FIG. 5) are provided at boundaries between the pixel electrodes 9a in longitudinal and traverse directions. As described below, the data line 6a has a laminated structure including an aluminum film and so on, and the scanning line 11a is made of, for example, a conductive polysilicon film. Further, the scanning line 11a is electrically connected to a gate electrode 3a opposing a channel region 1a', which is shown in a right-ascending oblique-line region, among a semiconductor layer 1a. That is, at the respective intersections of the scanning lines 11a and the data lines 6a, the gate electrode 3a connected to the scanning line 11a and the channel region 11a' are arranged to oppose each other, thereby constructing the TFT 30 for switching the pixels.

As shown in FIG. 1 which is a cross-sectional view taken along the line A-A' of FIG. 5, the electro-optical device has the TFT substrate 10 made of, for example, a quartz substrate, a glass substrate or a silicon substrate, and the counter substrate 20 made of, for example, a glass substrate or a quartz substrate, which is arranged to oppose the TFT substrate 10.

On the TFT substrate 10, as shown in FIG. 1, the pixel electrode 9a is provided, and an alignment film 16 suffered from a predetermined alignment treatment such as a rubbing treatment is provided thereon. The pixel electrode 9a is made of a transparent conductive film, for example, an ITO film. On the other hand, on the counter electrode 21 which is formed on the entire surface of the counter substrate 20, an alignment film 22 suffered from a predetermined alignment treatment such as a rubbing treatment is provided. Similarly to the above-mentioned pixel electrode 9a, the counter electrode 21 is made of a transparent conductive film such as an ITO film. The alignment films 16 and 22 are respectively made of a transparent organic film such as a polyimide film.

Between the TFT substrate 10 and the counter substrate 20 as such, an electro-optical material such as liquid crystal is sealed into a space surrounded by a sealing material 52 (see FIGS. 2 and 3), thereby forming a liquid crystal layer 50. The liquid crystal layer 50 has a predetermined alignment state by the alignment films 16 and 22 in a state in which an electric field from the pixel electrode 9a is not applied. The liquid crystal layer 50 is made of an electro-optical material into which one or more nematic liquid crystal materials are mixed. The sealing material 52 for bonding the TFT array substrate 10 and the counter substrate 20 along respective peripheries is an adhesive made of, for example, a photo-curable resin or a thermosetting resin. Further, in order to keep the distance between both substrates at a predetermined value, spacers such as glass fibers or glass beads are mixed into the sealing material 52.

On the other hand, on the TFT substrate 10, in addition to the pixel electrode 9a and the alignment film 16, various elements are provided in a laminated structure. As shown in FIG. 1, the laminated structure has a first layer (film formation layer) having the scanning lines 11a, a second layer including the TFTs 30 having the gate electrodes 3a or the like, a third layer including the storage capacitors 70, a fourth layer having the data lines 6a or the like, a fifth layer including a shield layer 400 or the like, and a sixth layer (an uppermost layer) including the pixel electrodes 9a, the alignment film 16 or the like in a sequence from the bottom. Further, in order to prevent electrical short between the above-mentioned elements, a base insulating film 12, a first interlayer insulating film 41, a second interlayer insulating film 42, a third interlayer insulating film 43, and a fourth interlayer insulating film 44 is respectively provided between the first layer and the second layer, between the second layer and the third layer, between the third layer and the fourth layer, between the fourth layer and the fifth layer, and between the fifth layer and the sixth layer. Further, in these interlayer insulating films 12, 41, 42, 43 and 44, a contact hole for electrically connecting a heavily doped source region 1d of the semiconductor layer 1a in the TFT 30 and the data line 6a, or the like is also provided. Hereinafter, the respective elements will be described in a sequence from the bottom.

The first layer includes at least one of high melting point metallic materials, for example, titanium (Ti), chromium: (Cr), tungsten (W), tantalum (Ta), molybdenum (Mo), and the scanning line 11a made of a metallic single substance, an alloy, metallic silicide, polysilicide, a laminate of them, or conductive polysilicon is provided. The scanning line 11a is patterned in a stripe shape along an X direction of FIG. 5 in a plan view. More specifically, the stripe-shaped scanning line 11a has a main line portion extending along the X direction of FIG. 5 and a projecting portion extending in a Y direction of FIG. 5 where the data line 6a or the shield layer 400 extends in parallel. Moreover, the projecting portions from the adjacent scanning lines 11a are not connected with each other, and thus the scanning lines 11a are separated one by one.

Thus, the scanning line 11a has a function of simultaneously controlling ON/OFF of the TFTs 30 disposed in the same row. Further, since the scanning line 11a is formed to approximately cover the region where the pixel electrode 9a is not formed, the scanning line 11a has a function of shielding light incident onto the TFT 30 from the lower side. Thus, an optical leak current in the semiconductor layer 1a of the TFT 30 can be suppressed from generating, such that high quality image display can be realized without flicker or the like.

In the second layer, the TFT 30 including the gate electrode 3a is provided. As shown in FIG. 1, the TFT 30 has a lightly doped drain (LDD) structure. The LDD structure includes the above-mentioned gate electrode 3a, the channel region 1a' of the semiconductor layer 1a made of, for example, a polysilicon film where a channel are formed by an electric field from the gate electrode 3a, an insulating film 2 having a gate insulating film which insulates the gate electrode 3a from the semiconductor layer 1a, and a lightly doped source region 1b, a lightly doped drain region 1c, a heavily doped source region 1d, and a heavily doped drain region 1e in the semiconductor layer 1a.

And then, in the second layer, a relay electrode 719 is formed with the same film as that of the above-mentioned gate electrode 3a. The relay electrode 719 is formed in an island shape to position at an approximately center of a side of the pixel electrode 9a in a plan view. The relay electrode 719 and the gate electrode 3a are formed with the same film. Thus, if the latter is made of, for example, a conductive polysilicon film, the former is also made of the conductive polysilicon film.

Moreover, the above-mentioned TFT 30 preferably has the LDD structure as shown in FIG. 1. Instead, however, the TFT 30 may have an offset structure where impurities are not injected into the lightly doped source region 1b and the lightly doped drain region 1c. Further, the TFT 30 may be a self-alignment type TFT where impurities are injected with high concentration with the gate electrode 3a as a mask and the heavily doped source region and the heavily doped drain region are formed in a self-alignment manner. Further, in the present embodiment, the gate electrode of the TFT 30 for switching the pixel has a single gate structure where only one gate electrode is arranged between the heavily doped source region 1d and the heavily doped drain region 1e. Instead, however, two or more gate electrodes may be arranged therebetween. As such, if the TFT has a dual-gate or triple or more-gate structure, a leak current injunction portions of the channel and the source and drain regions can be prevented, and thus an off current can be reduced. In addition, the semiconductor layer 1a constituting the TFT 30 may be a non-monocrystalline layer or a monocrystalline layer. In forming the monocrystalline layer, a known method such as a bonding method can be used. By forming the semiconductor layer 1a with the monocrystalline layer, high performance of peripheral circuits can be specifically realized.

On the above-mentioned scanning line 11a and below the TFT 30, the base insulating film 12 made of, for example, a silicon oxide film is provided. The base insulating film 12 has a function of insulating the TFT 30 from the scanning line 11a. Further, since the base insulating film 12 is formed on the entire surface of the TFT substrate 10, it has a function of preventing the characteristics of the TFT 30 for switching the pixel from changing due to roughness at the time of surface grinding, contaminants remaining after cleaning, or the like.

In the base insulating film 12, grooves (contact holes) 12cv having a width equal to a channel length of the semiconductor layer 1a which extends along the data line 6a described below are bored at both sides of the semiconductor layer 1a in a plan view. The gate electrode 3a which is laminated above the base insulating film 12 includes a downward concaved portion corresponding to the grooves 12cv. Further, since the gate electrode 3a is formed to completely cover the grooves 12cv, side wall portions 3b incorporated into the gate electrode 3a are provided to extend from the gate electrode 3a. Thus, the semiconductor layer 1a of the TFT 30 is covered from sides in a plan view, such that light is suppressed from being incident onto at least the side portions.

Further, the side wall portions 3b are formed to cover the grooves 12cv and lower ends of the side wall portions 3b contact the scanning line 11a. Here, since the scanning line 11a is formed in the stripe shape, as described above, the gate electrode 3a and the scanning line 11a in any one row have the same potential constantly as long as that row is focused.

Moreover, a structure where an additional scanning line including the gate electrode 3a is formed parallel to the scanning line 11a may be adopted. In this case, the scanning line 11a and the additional scanning line have a verbose wiring structure. Thus, for example, even when normal current application is not made due to a defect in a portion of the scanning line 11a, as long as the additional scanning line disposed in the same row as that of the scanning line 11a is well, the operation control of the TFT 30 can be still performed normally through the additional scanning line.

In the third layer, the storage capacitor 70 is provided. The storage capacitor 70 is formed by a lower electrode 71 serving as a pixel potential side capacitor electrode connected to the heavily doped drain region 1e of the TFT 30 and the pixel electrode 9a and a capacitor electrode 300 serving as a fixed potential side capacitor electrode which are arranged to oppose each other with a dielectric film 75 interposed therebetween. According to the storage capacitor 70, the potential storing property in the pixel electrode 9a can be drastically improved. Further, the storage capacitor 70 is formed not to reach a light transmitting region approximately corresponding to a region where the pixel electrode 9a is to be formed (specifically, to be fallen within a light-shielding region). Thus, the pixel aperture ratio of the entire electro-optical device can be maintained relatively largely, such that an image can be displayed brighter.

More specifically, the lower electrode 71 is made of, for example, a conductive polysilicon film and serves as the pixel potential side capacitor electrode. However, the lower electrode 71 may be made of a single-layered film or a multilayered film including metallic materials or alloys. In addition to the function as the pixel potential side capacitor electrode, the lower electrode 71 has a function of relaying and connecting between the pixel electrode 9a and the heavily doped drain region 1e of the TFT 30. The relay connection is performed through the relay electrode 719, as described below.

The capacitor electrode 300 serves as the fixed potential side capacitor electrode of the storage capacitor 70. The capacitor electrode 300 is electrically connected to the shield layer 400 having a fixed potential, such that the capacitor electrode 300 has the fixed potential.

And then, the capacitor electrode 300 is formed in an island shape to correspond to each pixel on the TFT substrate 10, and the lower electrode 71 is formed to have the approximately same shape as that of the capacitor electrode 300. Thus, the storage capacitor 70 can have the maximum capacitance under the same situations without having a useless spread in a plan view, that is, without lowering the pixel aperture ratio. That is, the storage capacitor 70 has larger capacitance with smaller area.

As shown in FIG. 1, the dielectric film 75 is made of a silicon oxide film such as a high-temperature oxide (HTO) film or low-temperature oxide (LTO) film having a relatively thin film thickness of, for example, 5 to 200 nm, or a silicon nitride film. From a viewpoint of increasing the storage capacitor 70, the dielectric film 75 may become thinner as long as reliability of the film is sufficiently ensured. And then, as shown in FIG. 1, the dielectric film 75 has a dual-layered structure of a silicon oxide film 75a as a lower layer and a silicon nitride film 75b as an upper layer. Since the silicon nitride film 75b having a relatively large dielectric constant exists, the capacitance of the storage capacitor 70 can increase. Further, since the silicon oxide film 75a exists, there is no case in which pressure-resistant property of the storage capacitor film 75 in the dual-layered structure, contrary advantages can be obtained.

Further, since the silicon nitride film 75b exists, the penetration of water into the TFT 30 can be prevented. Thus, the device can be worked for a relatively long time without causing the threshold voltage of the TFT 30 to increase. Moreover, in the present embodiment, the dielectric film 75 has the dual-layered structure, but a triple-layered structure of the silicon oxide film, the silicon nitride film, and the silicon oxide film, or a multilayered structure beyond that may be used.

On the above-mentioned TFT 30 to gate electrode 3a and relay electrode 719 and below the storage capacitor 70, a first interlayer insulating film 41 made of a silicate glass film, such as non-doped silicate glass (NSG), phospho-silicate glass (PSG), boro-silicate glass (BSG) or boro-phospho-silicate glass (BPSG), a silicon nitride film, or a silicon oxide film is provided. The first interlayer insulating film 41 is preferably made of NSG. And then, in the first interlayer insulating film 41, a contact hole 81 which electrically connects the heavily doped source region 1d of the TFT 30 and the data line 6a described below is provided while passing through the second interlayer insulating film 42 described below. Further, in the first interlayer insulating film 41, a contact hole 83 which electrically connects the heavily doped drain region 1e of the TFT 30 and the lower electrode 71 constituting the storage capacitor 70 is provided.

In addition, in the first interlayer insulating film 41, a contact hole 881 which electrically connects the lower electrode 71 as the pixel potential side capacitor electrode constituting the storage capacitor 70 and the relay electrode 719 is provided. In addition, in the first interlayer insulating film 41, a contact hole 882 which electrically connects the relay electrode 719 and a second relay electrode 6a2 described below is provided while passing through the second interlayer insulating film described below.

As shown in FIG. 1, the contact hole 882 is formed in a region other than the storage capacitor 70 and then the lower electrode 71 bypasses to the relay electrode 719 and leads upward through the contact hole 882. Thus, even when the lower electrode 71 is connected to the overlying pixel electrode 9a, it is not necessarily to form the lower electrode 71 wider than the dielectric film 75 and the capacitor electrode 300. Therefore, the lower electrode 71, the dielectric film 75, and the capacitor electrode 300 can be simultaneously patterned with one etching process. As a result, etching rates of the lower electrode 71, the dielectric film 75, and the capacitor electrode 300 can be easily controlled respectively, and a degree of freedom on the design of the film thickness or the like can increase.

Further, the dielectric film 75 is formed with the same shape as the lower electrode 71 and the capacitor electrode 300 and does not a spread. Thus, in the case in which a hydrogenation treatment is performed on the semiconductor layer 1a of the TFT 30, it has an advantage that hydrogen to be used in the hydrogenation treatment can be made to easily reach up to the semiconductor layer 1a through an opening portion around the storage capacitor 70.

Moreover, for the first interlayer insulating film 41, a firing treatment of about 1000° C. may be performed, such that ions injected into the semiconductor layer 1a or the polysilicon film constituting the gate electrode 3a may be activated.

In the fourth layer, the data line 6a is provided. The data line 6a is formed in a stripe shape to accord with a direction where extend parallel to the semiconductor layer 1a of the TFT 30, that is, to overlap the semiconductor layer 1a in the Y direction of FIG. 5. As shown in FIG. 1, the data line 6a is formed with a triple-layered film of a layer made of aluminum (a reference numeral 41A in FIG. 1), a layer made of titanium nitride (see a reference numeral 41TN in FIG. 1), and a layer made of a silicon nitride film (a reference numeral 401 in FIG. 1) in a sequence from the bottom. The silicon nitride film is patterned at a somewhat large size to cover the underlying aluminum layer and titanium nitride layer. Since the data line 6a includes aluminum having a relatively low resistance among them, the image signal can be supplied to the TFT 30 and the pixel electrode 9a without delay. On the other hand, the silicon nitride film having a relatively excellent property in blocking the penetration of moisture is formed on the data line 6a. Thus, moisture-proof property of the TFT 30 can be improved, such that the long life span thereof can be realized. The silicon nitride film is preferably a plasma silicon nitride film.

Further, in the fourth layer, a relay layer 6a1 for the shield layer and the second relay electrode 6a2 are formed with the same film as that of the data line 6a. As shown in FIG. 5, these are formed to have planar shapes consecutive to the data line 6a and to be separated from each other through patterning. That is, with paying attention to the data line 6a disposed at a leftmost side in FIG. 5, the relay layer 6a1 for the shield layer having an approximately quadrangular shape at a just right side, and the second relay electrode 6a2 having an area larger than the relay layer 6a1 for the shield layer and an approximately quadrangular shape at a right side thereto are formed. The relay layer 6a1 for the shield layer and the second relay electrode 6a2 are formed with the same process and in a triple-layered structure of a layer made of aluminum, a layer made of titanium nitride, and a layer made of a plasma nitride film in a sequence from the bottom. And then, the plasma nitride film is patterned at a somewhat large size to cover the underlying aluminum layer and titanium nitride layer. The titanium nitride layer serves as a barrier metal for preventing etching of contact holes 803 and 804, which are formed with respect to the relay layer 6a1 for the shield layer and the second relay electrode 6a2, from penetrating. Further, the plasma nitride film having a relatively excellent property in blocking the penetration of moisture is formed on the relay layer 6a1 for the shield layer and the second relay electrode 6a2. Thus, moisture-proof property of the TFT 30 can be improved, such that the long life span thereof can be realized. Moreover, the plasma nitride film is preferably a plasma silicon nitride film.

On the storage capacitor 70 and below the data line 6a, the second interlayer insulating film 42 made of, for example, the silicate glass film, such as NSG, PSG, BSG or BPSG, the silicon nitride film, or the silicon oxide film is formed. Specifically, the second interlayer insulating film 42 is preferably formed with plasma CVD method using a TEOS (tetraethyl orthosilicate) gas. In the second interlayer insulating film 42, the contact hole 81 which electrically connects the heavily doped source region 1d of the TFT 30 and the data line 6a is provided, and simultaneously a contact hole 801 which electrically connects the relay layer 6a1 for the shield layer and the capacitor electrode 300 as an upper electrode of the storage capacitor 70 is provided. In addition, in the second interlayer insulating film 42, the contact hole 882 which electrically connects the second relay electrode 6a2 and the relay electrode 719 is formed.

In the fifth layer, as shown in FIG. 5, the shield layer 400 is formed. The shield layer 400 is formed in a lattice shape to extend in the X and Y directions of the drawing in a plan view. A portion extending in the Y direction of FIG. 5 among the shield layer 400, specifically, is formed wider than the data line 6a to cover the data line 6a. Further, a portion extending in the X direction of FIG. 5 has a notched portion around a central portion of a side of each pixel electrode 9a to ensure a region where a third relay electrode 402 described below is to be formed.

In addition, in each corner portion of intersections of the shield layer 400 extending in the X and Y directions of FIG. 5, an approximately triangular portion is provided to cover the corner portion. Since the approximately triangular portion is formed in the shield layer 400, the shielding of light to the semiconductor layer 1a of the TFT 30 can be effectively performed. That is, light incident on the semiconductor layer 1a in an oblique direction is reflected or absorbed by the triangular portion not to reach the semiconductor layer 1a. Therefore, optical leak current can be suppressed and thus high quality image display can be realized without flicker or the like.

The shield layer 400 extends from an image display region 10a, where the pixel electrodes 9a are arranged, to its periphery and is electrically connected to a constant potential source to have a fixed potential. Moreover, as the constant potential source, a constant potential source such as positive power supply or negative power supply which is supplied to a data line driving circuit 101 described below may be used. Further, a constant potential source which is supplied to the counter electrode 21 of the counter substrate 20 may be used.

As such, if the shield layer 400 is formed to cover the entire data line 6a (see FIG. 5) and to have the fixed potential, influences by capacitance coupling between the data line 6a and the pixel electrode 9a can be eliminated. That is, the change in potential of the pixel electrode 9a in accordance with current application of the data line 6a can be avoided, and the possibility of causing display irregularity according to the data line 6a on an image can be reduced. Since the shield layer 400 is formed in the lattice shape, useless capacitance coupling can be suppressed not to be caused in a portion where the scanning line 1a extends.

In the present embodiment, the shield layer 400 is made of a single-layered structure of an aluminum film, unlike the data line 6a or the like.

Further, in the fifth layer, as the same layer of such a shield layer 400, the third relay electrode 402 serving as a relay layer is formed. In the present embodiment, the third relay electrode 402 made of titanium nitride has a dual-layered structure of a lower conductive film 402a mad of aluminum and an upper electrolytic corrosion preventing film 402b made of titanium nitride. Moreover, the shield layer 400 and the third relay electrode 402 are separated from each other through patterning without being consecutively formed in a planar shape.

In the third relay electrode 402, the lower conductive film 402a made of aluminum is connected to the second relay electrode 6a2 and the upper electrolytic corrosion preventing film 402b is connected to the pixel electrode 9a made of ITO or the like. That is, the third relay electrode 402 has a function of relaying an electrical connection between the second relay electrode 6a2 and the pixel electrode 9a through a contact hole 89 described below.

In the case in which aluminum and ITO are directly connected, electrolytic corrosion between them is caused, and thus a desired electrical connection is not realized due to disconnection of aluminum or insulation caused by the formation of alumina. To the contrary, in the present embodiment, since titanium nitride and ITO are connected, a favorable connection having a low contact resistance can be obtained.

The conductive film 402a of the third relay electrode 402 is connected to the second relay electrode 6a2 and the pixel electrode 9a through the contact hole 882 formed in the third interlayer insulating film 43 and the contact hole 89 formed in the fourth interlayer insulating film 44. Thus, the conductive film 402a is formed in a region including these contact holes.

To the contrary, in the present embodiment, the electrolytic corrosion preventing film 402b of the third relay electrode 402 is partially formed in a region surrounding the contact hole 89 which is a contact portion with the pixel electrode 9a.

That is, in the present embodiment, of the shield layer 400 and the third relay electrode 402 which are formed in the fifth layer, a laminated structure of the conductive film 402a made of aluminum and the electrolytic corrosion preventing film 402b made of titanium nitride or the like is adopted only in a portion of the region around the contact hole 89. Further, a single-layered structure of the conductive film made of aluminum or the like is adopted in other regions.

As such, the electrical connection between the third relay electrode 402 and the pixel electrode 9a can be realized favorably, and thus voltage application to the pixel electrode 9a or potential storing property in the pixel electrode 9a can be favorably maintained.

In addition, the shield layer 400 and the third relay electrode 402 include aluminum having relatively excellent light reflectivity. Further, titanium nitride, which has a relatively high light absorption rate, is not laminated on aluminum in most regions. Therefore, the shield layer 400 and the third relay electrode 402 can serve as the light-shielding layer without generating heat. That is, according to this configuration, incident light (see FIG. 1) proceeding to the semiconductor layer 1a of the TFT 30 can be blocked at an upper side thereof without generating heat.

Moreover, the above-mentioned capacitor electrode 300 and data line 6a also have the same light-shielding function. The shield layer 400, the third relay electrode 402, the capacitor electrode 300, and the data line 6a constitute a portion of a laminated structure which is constructed on the TFT substrate 10 and serve as an upper light-shielding film which blocks incident light onto the TFT 30 from an upper side thereof.

On the data line 6a and below the shield layer 400, the third interlayer insulating film 43 made of a silicate glass film such as NSG, PSG, BSG or BPSG, a silicon nitride film, or a silicon oxide film is formed. The third interlayer insulating film 43 is preferably formed with the plasma CVD method using the TEOS gas. In the third interlayer insulating film 43, a contact hole 803 which electrically connects the shield layer 400 and the relay layer 6a1 for the shield layer and a contact hole 804 which electrically connects the third relay electrode 402 and the second relay electrode 6a2 are provided respectively.

Moreover, for the second interlayer insulating film 42, the firing treatment in the first interlayer insulating film 41 described above may be not performed, such that the stress which is caused around the interface of the capacitor electrode 300 is alleviated.

In the sixth layer, as described above, the pixel electrodes 9a are formed in the matrix shape, and the alignment film 16 is formed on the pixel electrodes 9a. And then, below the pixel electrodes 9a, the fourth interlayer insulating film 44 made of a silicate glass film such as NSG, PSG, BSG or BPSG, a silicon nitride film, or a silicon oxide film is formed. The fourth interlayer insulating film 44 is preferably made of BPSG. In the fourth interlayer insulating film 44, the contact hole 89 which electrically connects the pixel electrode 9a and the third relay electrode 402 is provided. In the present embodiment, the surfaces of the third and fourth interlayer insulating films 43 and 44 are smoothed through CMP (chemical mechanical polishing) treatment or the like, such that alignment defects of the liquid crystal layer 50 due to stepped portions caused by various underlying wiring lines or elements can be reduced. However, instead of performing the smoothing treatment to the third and fourth interlayer insulating films 43 and 44, or in addition to the smoothing treatment, a groove may be bored in at least one of the TFT substrate 10, the base insulating film 12, the first interlayer insulating film 41, the second interlayer insulating film 42, and the third interlayer insulating film 43, and then wiring lines such as the data line 6a or the like, or the TFT 30 may be buried in the groove, thereby performing the smoothing treatment.

Further, the storage capacitor 70 is made of a triple-layered structure of the pixel potential side capacitor electrode, the dielectric film, and the fixed potential side capacitor electrode in a sequence from the bottom, but opposite structure may be used.

As regards three-dimensional and planar layouts of the respective elements, the present invention is not limited to shapes in the above-mentioned embodiment, but other shapes may be considered.

(Manufacturing Process)

Next, a manufacturing method of the liquid crystal device which is the electro-optical device according to the present embodiment will be described with reference to FIGS. 6 and 7. FIG. 6 is a flowchart showing a manufacturing method of the fifth and sixth layers, and FIG. 7 is a diagram showing the manufacturing method of the fifth and sixth layers sequentially.

First, the TFT substrate 10 such as the quartz substrate, the glass substrate or the silicon substrate is prepared. Here, preferably, the TFT substrate 10 is suffered from a pre-treatment, such as an annealing treatment at a high temperature of about 900 to 1300° C. under an inert gas atmosphere such as N (nitrogen), such that distortion in the TFT substrate 10 caused by subsequent high-temperature processes is reduced.

Next, on the entire surface of the TFT substrate 10 suffered from such a treatment, a metallic material, such as Ti, Cr, W, Ta or Mo, or a metallic alloy film, such as metallic silicide or the like, is deposited at a film thickness of about 100 to 500 nm, preferably 200 nm, by means of a sputtering method. And then, the metallic alloy film is patterned by means of photolithography and etching, such that the planarly stripe-shaped scanning lines 11a are formed.

Next, on the scanning lines 11a, the base insulating film 12 made of the silicate glass film, such as NSG (non-doped silicate glass), PSG (phospho-silicate glass), BSG (boro-silicate glass) or BPSG (boro-phospho-silicate glass), a silicon nitride film, or a silicon oxide film is formed with an atmospheric pressure or reduced-pressure CVD method which uses, for example, the TEOS (tetraethyl orthosilicate) gas, a TEB (tetraethyl borate) gas, a TMOP (tetramethyl oxyphosphate) or the like. The film thickness of the base insulating film 12 is set to, for example, about 500 to 2000 nm.

Next, the semiconductor layer 1a is formed. The semiconductor layer 1a is made of an amorphous silicon film on the base insulating film 12 which is formed by the reduce-pressure CVD method (for example, the CVD method with the pressure of 20 to 40 Pa), which uses a monosilane gas or a disilane gas at the flow of about 400 to 600 cc/min, under a relatively low temperature environment of about 450 to 550° C., preferably 500° C. Next, thermal treatment is performed at a temperature of about 600to 700° C. for about 1 to 10 hours, preferably 4 to 6 hours, under a nitrogen atmosphere, and thus a p-Si (polysilicon) film is grown in a solid phase up to the film thickness of about 50 to 200 nm, preferably about 100 nm. As a method for growing in the solid phase, an annealing treatment using RTA (rapid thermal annealing) or a laser annealing treatment using eximer laser or the like may be used. At this time, according to whether the TFT 30 for switching the pixel is n-channel type or p-channel type, dopant of V-group or III-group elements may be doped slightly by means of an ion injection method or the like. And then, the semiconductor layer 1a having a predetermined pattern is formed by means of photolithography and etching.

Next, the semiconductor layer 1a constituting the TFT 30 is thermally oxidized from a temperature of about 900 to 1300° C., preferably 1000° C. to form a lower gate insulating film. Subsequently, if necessary, the reduced-pressure CVD method or the like is performed to form an upper gate insulating film. Thus, the insulating film 2 (including the gate insulating film) made of a single-layered or multilayered high temperature silicon oxide film (HTO film) or silicon nitride film is formed. As a result, the semiconductor layer 1a has the thickness of about 30 to 150 nm, preferably about 35 to 50 nm, and the insulating film 2 has the thickness of about 20 to 150 nm, preferably about 30 to 100 nm.

Next, in order to control the threshold voltage Vth of the TFT 30 for switching the pixel, dopant of boron or the like is doped at a predetermined amount previously set into the n-channel region or p-channel region of the semiconductor layer 1a by means of ion injection or the like.

Next, the groove 12cv leading to the scanning line 11a is formed in the base insulating film 12. The groove 12cv is formed by means of dry etching such as reactive ion etching or reactive ion beam etching.

Next, a polysilicon film is deposited by means of the reduced-pressure CVD method, and further phosphorous (P) is thermally diffused, such that a conductive polysilicon film is formed. Instead of thermal diffusion, a doped silicon film into which P ions are introduced simultaneously with the film formation of the polysilicon film may be used. The film thickness of the polysilicon film is in a range of from about 100 to about 500 nm, preferably about 350 nm. And then, the gate electrode 3a having a predetermined pattern which includes a gate electrode portion of the TFT 30 is formed by means of photolithography and etching. When the gate electrode 3a is formed, the side wall portion 3b extending therefrom also is formed at the same time. The side wall portion 3b is formed by further performing the deposition of the polysilicon film to the inside of the groove 12cv. At this time, the bottom of the groove 12cv contacts the scanning line 11a, and thus the side wall portion 3b and the scanning line 11a are electrically connected to each other. In addition, at the time of patterning the gate electrode 3a, the relay electrode 719 also is formed at the same time.

Next, the lightly doped source region 1b and the lightly doped drain region 1c, and the heavily doped source region 1d and the heavily doped drain region 1e are formed in the semiconductor layer 1a. Herein, a case in which the TFT 30 has the LDD structure and is an n-channel type TFT will be exemplified. Specifically, first, in order to form the lightly doped source region 1b and the lightly doped drain region 1c, dopant of V-group elements such as P or the like is doped at a low concentration (for example, P ions at a dose of 1 to $3 \times 10^{13}$ cm$^2$) with the gate electrode 3a as a mask. Thus, the region of the semiconductor layer 1a below the gate electrode 3a becomes the channel region 1a'. At this time, the gate electrode 3a is used as the mask, and thus the lightly doped source region 1b and the lightly doped drain region 1c are formed in a self-alignment manner. Next, in order to form the heavily doped source region 1d and the heavily doped drain region 1e, a resist layer having a planar pattern wider than the gate electrode 3a is formed on the gate electrode 3a. Subsequently, dopant of V-group elements such as P or the like is doped at a high concentration (for example, P ions at a dose of 1 to $3 \times 10^{15}$ cm$^2$).

Moreover, doping may be not performed in two stages of low concentration and high concentration as described above. For example, the TFT having the offset structure may be adopted without performing doping of low concentration. Further, the self-alignment type TFT may be adopted by means of the ion injection technique, which uses P ions/B ions, with the gate electrode 3a (gate electrode) as a mask. By doping the impurities, the gate electrode 3a has a lower resistance.

Next, the first interlayer insulating film 41 made of the silicate glass film, such as NSG, PSG, BSG or BPSG, the silicon nitride film, or the silicon oxide film is formed on the gate electrode 3a, for example, by means of the atmospheric pressure or reduced-pressure CVD method which uses the TEOS gas, the TEB gas, or the TMOP gas, the film thickness of the first interlayer insulating film 41 is set to, for example, about 500 to 2000 nm. Here, the first interlayer insulating film 41 is preferably suffered from the annealing treatment at a high temperature of 800° C., thereby improving film quality thereof.

Next, the contact hole 83 and the contact hole 881 are provided in the first interlayer insulating film 41 by means of dry etching such as reactive ion etching or reactive ion beam etching. At this time, the contact hole 83 is formed to lead to the heavily doped drain region 1e of the semiconductor layer 1a and the contact hole 881 is formed to lead to the relay electrode 719.

Next, a metallic film such as Pt or a polysilicon film is film-formed at a film thickness of about 100 to 500 nm on the first interlayer insulating film 41 by means of the reduced-pressure CVD method or sputtering method, thereby forming the lower electrode 71 having a predetermined pattern. In this case, the metallic film is film-formed to bury the contact hole 83 and the contact hole 881, and thus the heavily doped drain region 1e, the relay electrode 719, and the lower electrode 71 are electrically connected to each other.

Next, the dielectric film 75 is formed on the lower electrode 71. The dielectric film 75 can be formed with various known techniques which are generally used to form the gate insulating film of the TFT, similar to the gate insulating film 2. The silicon oxide film 75a is formed by means of the above-mentioned thermal oxidization treatment or CVD method, and then the silicon nitride film 75b is formed by means of the reduced-pressure CVD method or the like. The thinner the dielectric film 75 is, the larger the capacitance of the storage capacitor 70 is. Therefore, on an assumption that defects such as film breaks are not caused, it is advantageous to form the extremely thin dielectric film having the film thickness of 50 nm or less. Next, the polysilicon film or metallic film such as Al (aluminum) is film-formed at a film thickness of about 100 to 500 nm on the dielectric film 75 by means of the reduced-pressure CVD method or sputtering method, thereby forming the capacitor electrode 300.

Next, the respective films constituting the lower electrode 71, the dielectric film 75, and the capacitor electrode 300 are patterned collectively, and thus the lower electrode 71, the dielectric film 75, and the capacitor electrode 300 are formed, thereby forming the storage capacitor 70.

Next, the second interlayer insulating film 42 made of the silicate glass film, such as NSG, PSG, BSG or BPSG, the silicon nitride film, or the silicon oxide film is formed, for example, by means of the atmospheric pressure or reduced-pressure CVD method which uses the TEOS gas, preferably, by means of the plasma CVD method. In the case in which aluminum is used for the capacitor electrode 300, it is necessary to film-form it at a low temperature by means of the plasma CVD method. The film thickness of the second interlayer insulating film 42 is set to, for example, about 500 to 1500 nm. Next, the contact holes 81, 801 and 882 are provided in the second interlayer insulating film 42 by means of dry etching such as reactive ion etching or reactive ion beam etching. At this time, the contact hole 81 is formed to lead to the heavily doped source region 1*d* of the semiconductor layer 1*a*, the contact hole 801 is formed to lead to the capacitor electrode 300, and the contact hole 882 is formed to lead to the relay electrode 719.

Next, on the entire surface of the second interlayer insulating film 42, a metallic film of low resistance metallic material, such as aluminum or the like having light-shielding property, or metallic silicide is deposited at a thickness of about 100 to 500 nm, preferably about 300 nm, by means of the sputtering method. And then, the metallic film is suffered from photolithography and etching, thereby forming the data line 6*a* having a predetermined pattern. In this situation, at the time of patterning, the relay layer 6*a*1 for the shield layer and the second relay electrode 6*a*2 are formed at the same time. The relay layer 6*a*1 for the shield layer is formed to cover the contact hole 801, and the second relay electrode 6*a*2 is formed to cover the contact hole 882.

Next, a film made of titanium nitride is formed on the entire surface of upper layers of these elements by means of the plasma CVD method, and then patterning treatment is performed such that only a portion on the data line 6*a* remains behind. However, the layer made of titanium nitride may be formed such that portions on the relay layer 6*a*1 for the shield layer and the second relay electrode 6*a*2 remain behind. If necessary, the layer made of titanium nitride may be formed such that it remains behind over the entire surface of the TFT substrate 10. Further, the layer made of titanium nitride may be film-formed simultaneously with the film formation of aluminum and the layer made of titanium nitride and aluminum may be collectively etched.

Next, the third interlayer insulating film 43 made of the silicate glass film, such as NSG, PSG, BSG or BPSG, the silicon nitride film, or the silicon oxide film is formed to cover the data line 6*a* or the like, for example, by means of the atmospheric pressure or reduced-pressure CVD method which uses the TEOS gas, preferably by means of the plasma CVD method which can film-forms at a low temperature. The film thickness of the third interlayer insulating film 43 is set to, for example, about 500 to 3500 nm. Next, as shown in FIG. 1, the third interlayer insulating film 43 is smoothed, for example, by using the CMP treatment.

Next, the contact holes 803 and 804 are provided in the third interlayer insulating film 43 by means of dry etching such as reactive ion etching or reactive ion beam etching. At this time, the contact hole 803 is formed to lead to the relay layer 6*a*1 for the shield layer, and the contact hole 804 is formed to lead to the second relay electrode 6*a*2.

Next, the shield layer 400 and the third relay electrode 402 are formed on the third interlayer insulating film 43 by means of the sputtering method or plasma CVD method. FIG. 6 shows formation processes of the shield layer 400 and the third relay electrode 402.

In the step S1 of FIG. 6, as shown in PROCESS (1) of FIG. 7, first, a lower layer film 40*a* made of, for example, a low resistance material such as aluminum is formed just on the third interlayer insulating film 43, and then an upper layer film 40*b* made of, for example, titanium nitride or a material which prevents an electrolytic corrosion in ITO constituting the pixel electrode 9*a* described below is formed on the lower layer film 40*a*. Next, in the step S2, as shown in PROCESS (2) of FIG. 7, a mask 40*c* is formed, and then the lower layer film 40*a* and the upper layer film 40*b* are patterned together using the mask 40*c*.

Next, as shown in PROCESS (3) of FIG. 7, a mask 40*d* is formed only in the contact portion of the third relay electrode 402 and the pixel electrode 9*a* including the contact hole 89 which is formed in the fourth interlayer insulating film 44 described below. And then, in the step S3, the titanium nitride film constituting the upper layer film 40*b* is removed by using the mask 40*d*. For example, the titanium nitride film is removed by means of dry etching which uses, for example, a mixed gas of $CF_4$ and $O_2$ having a sufficiently large selection ratio with respect to aluminum. Further, even when a mixed gas of $CHF_3$, $CF_4$ and Ar is used as the etching gas, the titanium nitride film can be removed while remaining aluminum behind.

Thus, for the shield layer 400, the upper layer film 40*b* is completely removed, such that the shield layer 400 having a single-layered structure of the lower layer film 40*a* is formed. On the other hand, for the third relay electrode 402, only the contact portion has a multilayered structure of the lower layer film 40*a* made of aluminum and the upper layer film 40*b* made of titanium nitride, and other portions has the single-layered structure of only the lower layer film 40*a*. The lower layer film 40*a* of the third relay electrode 402 becomes the conductive film 402*a* and the upper layer film 40*b* thereof becomes the electrolytic corrosion preventing film 402*b*.

Next, the fourth interlayer insulating film 44 made of the silicate glass film, such as NSG, PSG, BSG or BPSG, the silicon nitride film, or the silicon oxide film is formed, for example, by means of the atmospheric pressure or reduced-pressure CVD method which uses the TEOS gas (step S4). The film thickness of the fourth interlayer insulating film 44 is set to, for example, about 500 to 1500 nm.

Next, as shown in FIG. 1, the fourth interlayer insulating film 44 is smoothed, for example, by using the CMP treatment. Next, the contact hole 89 is provided in the fourth interlayer insulating film 44 by means of dry etching such as reactive ion etching or reactive ion beam etching (step S5). At this time, the contact hole 89 is formed to lead to the electrolytic corrosion preventing film 402*b* of the third relay electrode 402.

Next, a transparent conductive film such as an ITO film or the like is deposited at a thickness of about 50 to 200 nm on the fourth interlayer insulating film 44 by means of the sputtering treatment or the like. And then, the transparent conductive film is suffered from photolithography and etching, thereby forming the pixel electrode 9*a* (step S6).

Moreover, when the electro-optical device is used as a reflection type, the pixel electrode 9*a* may be formed with a non-transparent material having high reflectance, such as Al or the like. Next, a polyimide-based coat solution for the alignment film is coated on the pixel electrode 9*a*, and the rubbing treatment or the like is performed on the coated film in a predetermined direction to have a predetermined pretilt angle, thereby forming the alignment film 16.

As such, in the present embodiment, the conductive film and ITO constituting the pixel electrode are connected to each other with titanium nitride interposed therebetween, and thus an electrolytic corrosion in ITO can be prevented from occurring. Further, the entire region of the shield layer serving as the light-shielding layer and a region other than the contact portion of the relay electrode have the single-layered structure of the conductive film while titanium nitride is removed. Thus, the generation of heat can be drastically reduced.

Moreover, in the first embodiment, the example in which the titanium nitride film serving as the electrolytic corrosion preventing film is removed from the entire portion except for the contact portion has been described. However, if the titanium nitride film is removed from a portion of the shield layer and the relay electrode which are formed in the same layer, it is apparent that a heat preventing effect can be expected. For example, the shield layer may have the single-layered structure and the relay electrode may have the multilayered structure of the conductive film and the electrolytic corrosion preventing film over the entire region thereof.

Figure 8:
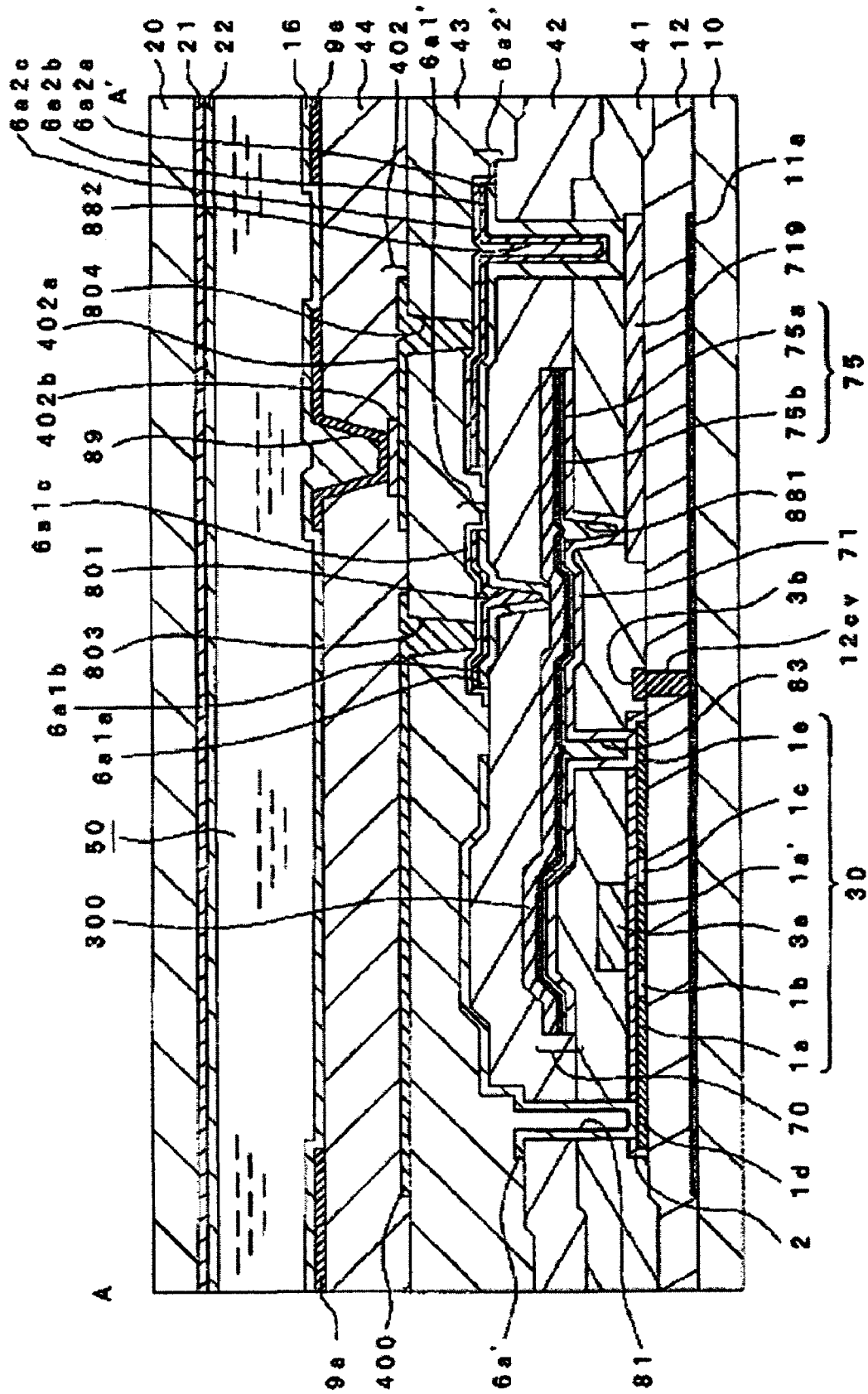
FIG. 8 is a cross-sectional view showing a cross-sectional structure of an electro-optical device according to a second embodiment of the present invention.
Figure 9:
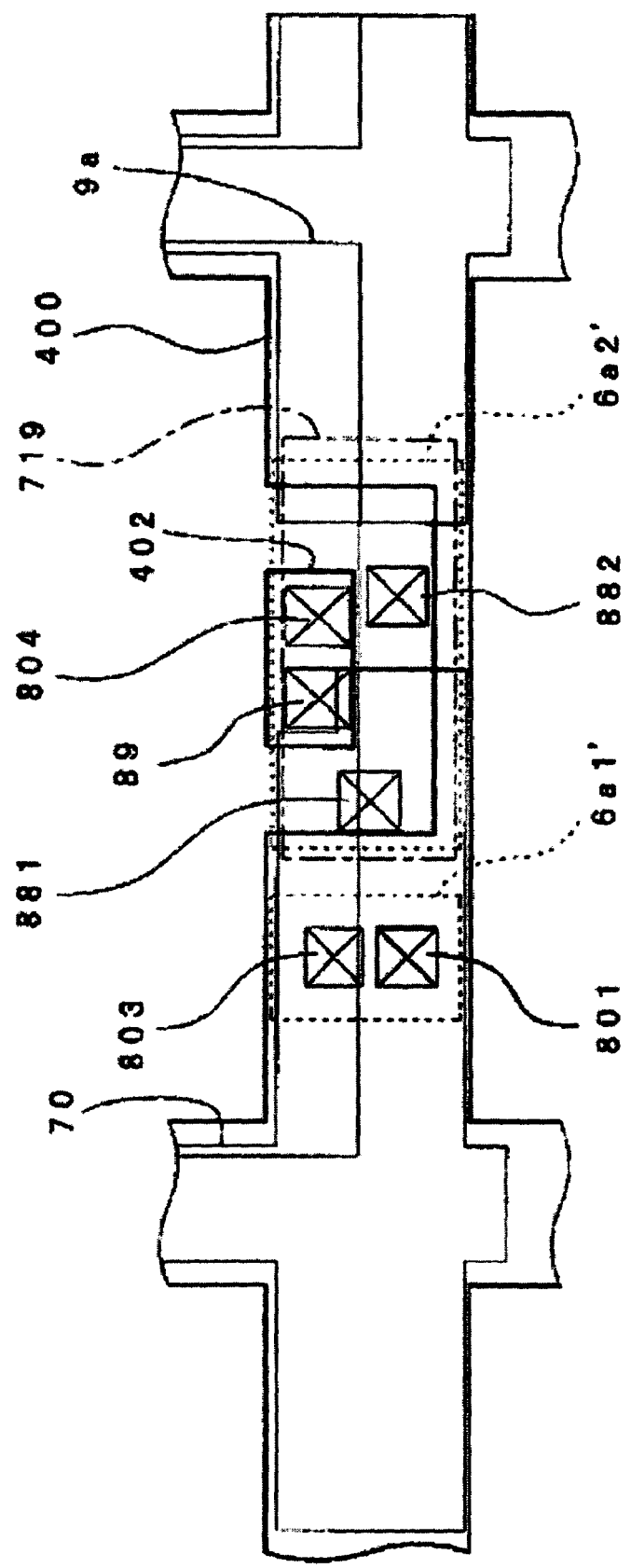
FIG. 9 is a plan view partially showing film formation patterns of respective layers of a liquid crystal device which is the electro-optical device according to the second embodiment.

FIG. 8 is cross-sectional view showing a cross-sectional structure of an electro-optical device according to a second embodiment of the present invention, and FIG. 9 is a plan view partially showing film formation patterns of respective layers of a liquid crystal device which is the electro-optical device according to the second embodiment. In FIGS. 8 and 9, the same elements as those in FIGS. 1 to 5 are represented by the same reference numerals, and the descriptions thereon will be omitted. Moreover, FIG. 9 shows the film formation pattern in a light-shielding region along a side of the pixel electrode 9a in one pixel.

The present embodiment is different from the first embodiment in that, instead of the data line 6a, the relay layer 6a1 for the shield layer, and the second relay electrode 6a2, a data line 6a', a relay layer 6a1' for the shield layer, and a second relay electrode 6a2' are used.

In the present embodiment, the data line 6a', the relay layer 6a1' for the shield layer, and the relay electrode 6a2' have the same planar shapes as those of the data line 6a, the relay layer 6a1 for the shield layer, and the relay electrode 6a2, respectively. The data line 6a' is made of a conductive film such as an aluminum film or the like. That is, the data line 6a' does not have the layer made of titanium nitride, unlike the data line 6a.

On the other hand, the relay layer 6a1 for the shield layer which is formed in the same layer as that of the data line 6a' has a triple-layered structure of a titanium nitride film 6a1a, an aluminum film 6a1b, and a titanium nitride film 6a1c in a sequence from the bottom. Further, the second relay electrode 6a2' is also formed with the same process as that of the data line 6a' and the relay layer 6a1' for the shield layer, and also has a triple-layered structure of a titanium nitride film 6a2a, an aluminum film 6a2b, and a titanium nitride film 6a2c in a sequence from the bottom.

As shown in FIG. 9, contact holes 801 and 803 are formed in the region of the relay layer 6a1' for the shield layer in a plan view. In this region, as shown in FIG. 8, the titanium nitride film 6a1c as an uppermost layer of the relay layer 6a1' for the shield layer and the shield layer 400 are connected to each other through the contact hole 803. Further, the titanium nitride film 6a1a as a lowermost layer of the relay layer 6a1' for the shield layer and the storage capacitor 70 are connected to each other through the contact hole 801. That is, the titanium nitride film as an oxidization preventing film is disposed in the contact portions of the relay layer 6a1' for the shield layer and the overlying and underlying layers, such that contact resistance can be sufficiently reduced.

Similarly, a contact hole 882 is formed in the region of the relay electrode 719 in a plan view. In this region, as shown in FIG. 8, the titanium nitride film 6a2a as a lowermost layer of the second relay electrode 6a2' and the relay electrode 719 are connected to each other through the contact hole 882. That is, in this case, the titanium nitride film as an oxidization preventing film is also disposed in a contact portion of the second relay electrode 6a2' and the underlying relay electrode 719, such that a contact resistance can be sufficiently reduced.

Similarly, a contact hole 804 is formed in the region of the second relay electrode 6a2' in a plan view. In this region, as shown in FIG. 8, the titanium nitride film 6a2c as an uppermost layer of the second relay electrode 6a2' and the third relay electrode 402 are connected to each other through the contact hole 804. That is, in this case, the titanium nitride film as an oxidization preventing film is disposed in a contact portion of the second relay electrode 6a2' and the overlying third relay electrode 402, such that a contact resistance can be sufficiently reduced.

As such, in the present embodiment, the titanium nitride films as the oxidization preventing film between the conductive films of the respective layers are provided in the contact portions of the conductor layers vertically arranged, such that the contact resistance can be sufficiently reduced. Further, the titanium nitride film is provided only around the contact portions of the conductor layers vertically arranged while it does not formed in other portions. Therefore, even when the conductor layer is used as the light-shielding layer, the generation of heat can be drastically reduced.

Further, in the second embodiment, the triple-layered structure is formed over the entire region of the relay layer 6a1' for the shield layer and the second relay electrode 6a2'. Alternatively, however, it is apparent that only the contact portion may have a triple-layered structure and other portions may have, for example, a single-layered structure of an aluminum film.

Further, in the second embodiment, the relay layer 6a1' for the shield layer and the second relay electrode 6a2' have the triple-layered structure. Alternatively, however, the titanium nitride film as the oxidization preventing film may be disposed in the contact portions between the conductor layers. It is apparent that the relay layer 6a1' for the shield layer and the second relay electrode 6a2' may have the single-layered structure and the contact portion in an overlying or underlying layer thereof may have the multilayered structure including the titanium nitride film.

Further, the electro-optical device of the present invention can be similarly applied to an active matrix type liquid crystal display panel (for example, a liquid crystal display panel having TFT (thin film transistor) or TFD (thin film diode) as a switching element), as well as a passive matrix type liquid crystal display panel. Further, the present invention can be similarly applied to various electro-optical devices such as electroluminescent devices, organic electroluminescent devices, plasma display devices, electrophoretic display devices, or devices using electron emission (field emission display, surface-conduction electron-emitter display or the like), as well as the liquid crystal display panel.

Next, as regards an embodiment of a projection type color display device which is an example of an electronic apparatus using the above-mentioned electro-optical device as a light valve, an entire configuration thereof, specifically, an optical configuration will be described. Here, FIG. 10 is a schematic cross-sectional view of a projection type color display device.

Figure 10:
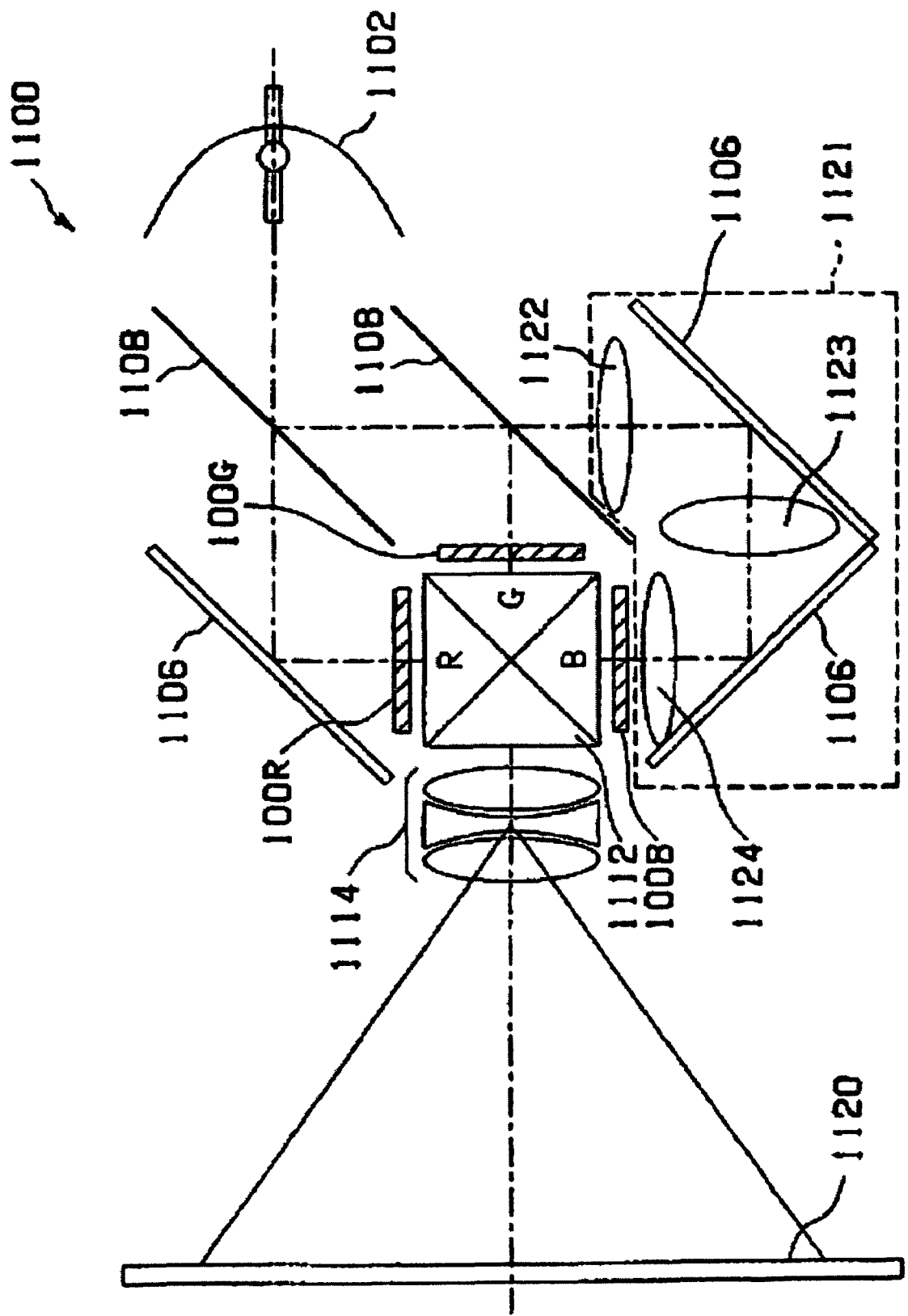
FIG. 10 is a schematic cross-sectional view of a projection type color display device.

In FIG. 10, a liquid crystal projector 1100 which is an example of the projection type color display device according to the present embodiment has three liquid crystal modules each including a liquid crystal device in which a driving circuit is mounted on a TFT substrate. The liquid crystal modules are used as light valves 100R, 100G and 100B for RGB respectively. In the liquid crystal projector 1100, projection light emitted from a lamp unit 1102 of a white light source, such as a metal halide lamp, is divided into three primary color light components of R (red), G (green), and B (blue) by three mirrors 1106 and two dichroic mirrors 1108, and the three primary color light components are introduced to the light valves 100R, 100G, and 100B corresponding to the respective colors of R, G, and B. At this time, the B light component is introduced via a relay lens system 1121 which has an incident lens 1122, a relay lens 1123, and an emission lens 1124 in order to prevent optical loss due to a long optical path. And then, the three primary color light components modulated by the light valves 100R, 100G, and 100B are synthesized by a dichroic prism 1112. After a color image is synthesized from these color light components, the color image is projected onto a screen 1120 through a projection lens 1114.

The present invention is not limited to the above-mentioned embodiments, but it can be suitably modified within a range without departing from a subject matter or spirit of the present invention read on the appended claims and the specification. An electro-optical device, a method of manufacturing the electro-optical device, and the electronic apparatus will be also fallen within a technical range of the present invention. As an electro-optical device, an electrophoretic device or an electroluminescent device can be used.

What is claimed is:

1. An electro-optical device comprising:
   above a substrate,
   a data line;
   a transistor electrically connected to the data line;
   a pixel electrode electrically connected to the transistor;
   an island-shaped first relay electrode that is separated laterally from the transistor, is located in a same layer as one layer of the transistor, and is electrically connected to the transistor;
   an island-shaped second relay electrode in a layer above the first relay electrode and electrically connected to the first relay electrode;
   an island-shaped third relay electrode in a layer above the second relay electrode, the third relay electrode being electrically connected to the second relay electrode and electrically connected to the pixel electrode, the third relay electrode having a multilayered structure including a conductor film and an electrolytic corrosion prevention film, the conductor film being formed from a single layer of aluminum, the electrolytic corrosion prevention film being formed from titanium or titanium nitride in a certain two-dimensional area on a substantially flat single surface of the conductor film and not being formed in other two-dimensional areas on the flat single surface of the conductor film;
   an interlayer insulating film formed between the pixel electrode and the third relay electrode;
   a contact hole provided in the interlayer insulating film at a position overlapping the certain two-dimensional area in plan view, the contact hole electrically connecting the pixel electrode and the third relay electrode in a contact portion; and
   a light shield formed from the same single layer of aluminum as the conductor layer of the third relay electrode and being electrically discontinuous from the conductor film of the third relay electrode, the light shield being electrically connected to a constant potential source to have a fixed potential, the light shield having a cutout section along an elongated portion thereof, the third relay electrode being disposed within the cutout section of the light shield in plan view, the second relay electrode covering the cutout section from a position below the third relay electrode.

2. An electro-optical device according to claim 1, further comprising an other data line adjacent to the data line, the cutout portion being located between the data line and the other data line.

3. An electro-optical device according to claim 1, the electrolytic corrosion prevention film of the third relay electrode being located only in a region that overlaps the contact hole in plan view.

4. An electro-optical device according to claim 1, the data line including only a single layer of aluminum film, the second relay electrode including a layered structure of a titanium nitride film, an aluminum film that is the same aluminum film as the aluminum film of the data line, and another titanium nitride film in a sequence from the bottom.

5. An electro-optical device according to claim 4, the first relay electrode includes a layer made from the same material and in the same layer as a gate electrode of the transistor.

* * * * *